US006407875B1

(12) United States Patent
Pierson

(10) Patent No.: US 6,407,875 B1
(45) Date of Patent: Jun. 18, 2002

(54) METHOD AND APPARATUS FOR FILTERING A SIGNAL AND PRODUCING A RESPONSE

(75) Inventor: Richard C. Pierson, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/098,308

(22) Filed: Jun. 16, 1998

(51) Int. Cl.[7] .................................................. G11B 5/09
(52) U.S. Cl. ........................ 360/46; 360/65; 333/28 R
(58) Field of Search .............................. 360/46, 65, 67; 333/18, 28 R; 708/322, 323

(56) References Cited

U.S. PATENT DOCUMENTS 5,355,329 A * 10/1994 Lyon .......................... 708/320

OTHER PUBLICATIONS

Transforms in Signals and Systems by Peter Kraniauskas, pp. 440–443, published Dec., 1992.*

Laber, Carlos A., and Paul R. Gray, "A 20–MHz Sixth–Order BiCMOS Parasitic–Insensitive Continuos–Time Filter and Second–Order Equalizer Optimized for Disk–Drive Read Channels," *IEEE Journal of Solid–State Circuits*, Vol. 28, No. 4, pp. 462–470, Apr. 1993.

De Veirman, Geert A., and Richard G. Yamasaki, "Monolithic 10–30 MHz Tunable Bipolar Bessel Lowpass Filter," *IEEE Proc. ISCAS*, pp. 1444–1447, 1991.

* cited by examiner

*Primary Examiner*—Alan T. Faber
(74) *Attorney, Agent, or Firm*—Bret J. Petersen; Frederick J. Telecky, Jr.

(57) ABSTRACT

An apparatus for filtering an input signal includes a first second order filter section having an output and an intermediate output, a second second order filter section having an input connected to the output of the first second order filter, and a gain stage coupling the output of the first second order filter section and the intermediate output of the first second order filter section to the output of the second second order filter section. The gain stage is coupled such that a transfer function between the output of the second second order filter section and the input of the second second order filter section is a biquadratic transfer function.

20 Claims, 2 Drawing Sheets

025# METHOD AND APPARATUS FOR FILTERING A SIGNAL AND PRODUCING A RESPONSE

TECHNICAL FIELD OF THE INVENTION

This invention relates generally to filtering electronic signals and more particularly to a method and apparatus for filtering a signal and producing a response having a boost and asymmetric zeros and hard disk drive incorporating same.

BACKGROUND OF THE INVENTION

Filters used in high-frequency applications, such as disk drive, video, and data transmission applications are generally implemented as continuous-time active filters. These continuous-time active filters are often implemented using transconductance-capacitor ("$g_{m\_}C$") filters. Continuous-time active filters of a desired order may be constructed by serially coupling or connecting $g_{m\_}C$ filter stages until a filter having the desired order and response is provided. For example, continuous-time active filters configured as second order filters may be provided using $g_{m\_}C$ filter stages. A second order filter is one whose transfer function contains complete quadratic equations in both the numerator and the denominator and can be implemented, for example, as a low pass filter, a high pass filter, or a notch filter.

In many applications, such as in data transmission and disk drive applications, it is advantageous to provide a continuous-time active filter with a constant group delay characteristic over a desired range of frequencies to prevent distortion of a signal waveform. The group delay may be defined as the negative of the derivative of the phase with respect to frequency. Furthermore, it is often advantageous and desirable to provide an adjustable or selectable group delay characteristic. It is also often advantageous and desirable to provide amplification of selected frequency components or frequency spectrums. The amplification of selected frequency components or frequency spectrums may be referred to as "boost."

For illustration purposes, the standard second order low pass filter transfer function is provided below:

$$H(s) = \frac{\omega_o^2}{s^2 + s\frac{\omega_o}{Q} + \omega_o^2}$$

In order to provide an adjustable group delay that will be constant throughout the frequency spectrum, and boost, the standard second order low pass transfer function may be converted into the following equation:

$$H(s) = \frac{-ks^2 + bs + \omega_o^2}{s^2 + s\frac{\omega_o}{Q} + \omega_o^2}$$

where the term "$-ks^2$" is a boost term, and the term "bs" is an asymmetric zero term which is used to provide the adjustable group delay. The boost term, $-ks^2$, increases high frequency gain by adding two real symmetric zeros to the transfer function. Since one of the zeros is positive and the other is negative, and the two are of equal magnitude, the phase is not changed. The amplitude of the boost may be programmable and may be adjusted according to the value of "k." The asymmetric zero term, bs, causes the real zeros to no longer be symmetric which results in a change in the phase and hence the group delay of the transfer function. In order to provide asymmetry, b may be provided as either a positive value or a negative value, but not at a zero value. Thus, the group delay may be adjusted by changing the "b" term of the asymmetric zero term.

In disk drive applications, the boost may be used for such applications as pulse slimming and/or read channel equalization. The asymmetric zeros or adjustable group delay may be used in such applications to adjust the group delay characteristics of the disk drive read channel or data channel to optimize performance.

Prior attempts at providing boost and adjustable group delay have proven unsatisfactory at best. For example, one prior attempt at providing boost and adjustable group delay involved the use of an amplifier for amplifying an input signal to a $g_{m\_}C$ filter stage and driving the bottom plate or electrode of the output capacitor of the $g_{m\_}C$ filter stage. This presented serious technical problems due to the existence of a parasitic capacitor whose bottom plate could not be driven by the amplifier. In some cases, the value of the parasitic capacitor was up to thirty percent of the value of the output capacitor of the $g_{m\_}C$ filter stage. As a result, the effective boost term, $ks^2$, was greatly reduced. Because the boost term was significantly reduced, an amplifier having, a very high gain had to be provided to overcome this limitation. The high gain amplifier significantly increased overall power consumption. Also, the value of the parasitic capacitance was difficult, if not impossible, to predict because of semiconductor fabrication variations. This required the use of an amplifier with adjustable gain, which further increased circuitry and costs. Furthermore, the amplifier generally had a limited bandwidth, which reduced its effectiveness for applications using high frequency signals.

Another prior attempt at providing boost involved amplifying a current provided through the capacitor of a $g_{m\_}C$ filter stage of a continuous-time filter. This technique has also proven unsatisfactory. The current provided through the capacitor is often large and consumes a significant amount of power when amplified. The increased power consumption results in increased circuitry area to handle the increased power consumption. The increased circuitry area increases undesirable circuitry parasitics.

SUMMARY OF THE INVENTION

From the foregoing it may be appreciated that a need has arisen for a method and apparatus for providing boost and asymmetry in a continuous-time filter that eliminate or reduce the problems described above. In accordance with the present invention, a method and apparatus for filtering a signal and producing a response having boost and asymmetrical zeros and hard disk drive incorporating same are provided that address the disadvantages and problems outlined above.

According to one embodiment of the invention, an apparatus for filtering an input signal includes a first second order filter section having an output and an intermediate output, a second second order filter section having an input connected to the output of the first second order filter, and a gain stage coupling the output of the first second order filter section and the intermediate output of the first second order filter section to the output of the second second order filter section. The gain stage is coupled such that a transfer function between the output of the second second order filter section and the input of the second second order filter section is a biquadratic transfer function.

According to another embodiment of the invention, a hard disk drive system includes a rotating magnetic disk having information magnetically stored thereon, a read head supported adjacent said disk and operative to read information from said disk and to output an analog signal embodying the information, and a read channel circuit that has an input coupled to the analog signal, the read channel including a filter for filtering a signal indicative of the analog signal. The filter includes a first second order filter section having an output and an intermediate output, a second second order filter section having an input connected to the output of the first second order filter, and a gain stage coupling the output of the first second order filter section and the intermediate output of the first second order filter section to the output of the second second order filter section. The filter is coupled such that a transfer function between the output of the second second order filter section and the input of the second second order filter section is a biquadratic transfer function.

Embodiments of the invention provide numerous technical advantages. For example, in one embodiment of the invention, a filter is provided that has a boost and asymmetric zeros that may be specified without otherwise affecting the response of the filter. In addition, such boost and asymmetric zeros are provided without suffering the above-described problems associated with driving the bottom plate of a capacitor.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1 through 4 of the drawings, like numerals being used for like and corresponding parts of the various drawings.

Figure 1:
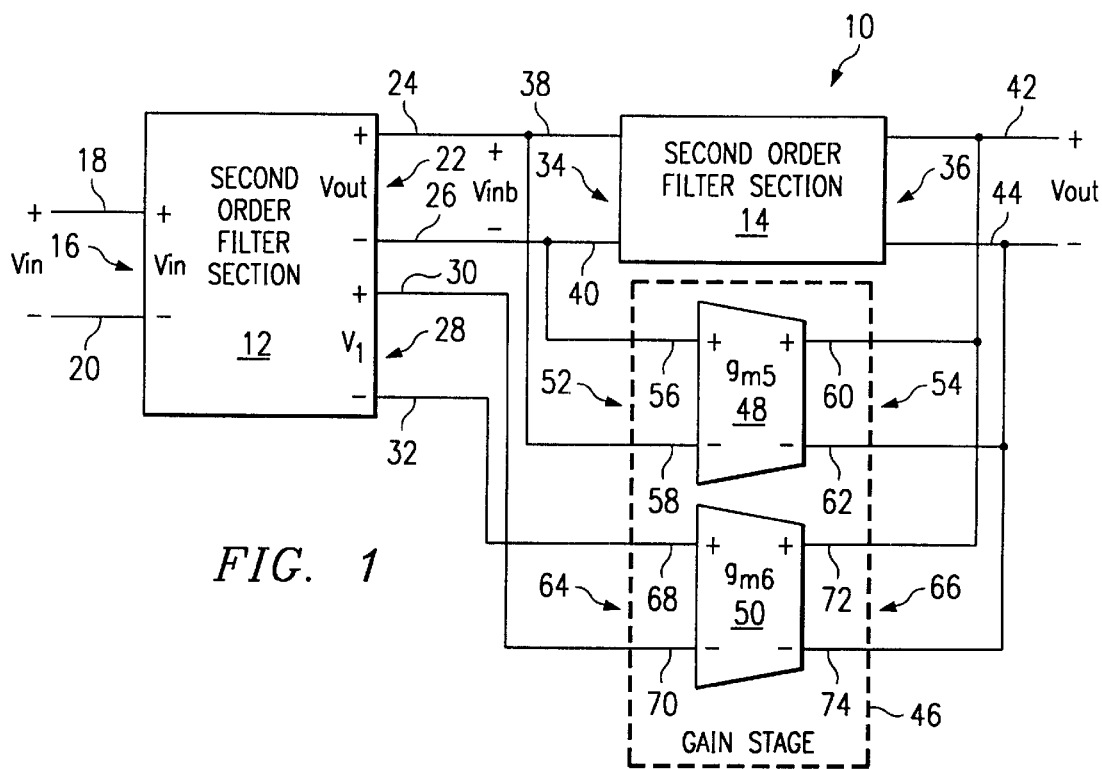
FIG. 1 is a block diagram of a filter that produces boost and asymmetric zeros according to the teachings of the present invention.

FIG. 1 is a block diagram of a filter 10 that produces boost and asymmetric zeros according to the teachings of the present invention. Filter 10 includes second order filter sections 12 and 14. A second order filter section is a filter section that has a transfer function between an output and an input that has a denominator that is second order and a numerator that is no more than second order. Second order filter sections 12 and 14 each produce a specific second order transfer function, as described in greater detail below in conjunction with FIGS. 2 and 3. Filter 10 also includes a gain stage 46 with connections to second order filter section 12 and second order filter section 14 that produces a desired transfer function between portions of filter 10 having asymmetric zero and a boost term.

Second order filter section 12 includes a differential input 16 having a positive node 18 and a negative node 20. Differential input 16 receives a differential voltage $V_{in}$. Second order filter section 12 also includes a differential output 22. Differential output 22 includes a positive node 24 and a negative node 26. Differential output 22 provides a voltage $V_{out}$ across nodes 24 and 26. Second order filter section 12 also includes a differential intermediate output 28. Intermediate output 28 includes a positive node 30 and a negative node 32. An intermediate differential output voltage $V_1$ is provided between nodes 30 and 32.

Second order filter section 14 includes a differential input 34 and a differential output 36. Differential input 34 includes a positive node 38 and a negative node 40. Differential output 22 is coupled to differential input 34 of second order filter section 14. Differential output 36 of second order filter section 14 includes a positive node 42 and a negative node 44. Differential output 36 provides an output voltage $V_{out}$ for filter 10.

Gain stage 46 includes transconductance stages 48 and 50. A transconductance stage receives a voltage as an input and produces a current as an output. A transconductance stage has a transconductance defined as $g_m = I_{out}/V_{in}$. Transconductance stage 48 has a transconductance of $g_{m5}$, and transconductance stage 50 has a transconductance of $g_{m6}$.

Transconductance stage 48 includes a differential input 52 and a differential output 54. Differential input 52 has a positive node 56 and a negative node 58. Positive node 56 of transconductance stage input 52 is coupled to negative node 26 of differential output 22 of second order filter section 12. Negative node 58 of transconductance stage 48 is coupled to positive node 24 of differential output 22 of second order filter section 12. Differential output 54 includes a positive node 60 and a negative node 62. Positive node 60 of output 54 is coupled to positive node 42 of output 36 of second order filter section 14. Negative node 62 of output 54 of transconductance stage 48 is coupled to negative node 44 of output 36 of second order filter section 14.

Transconductance stage 50 includes a differential input 64 and a differential output 66. Differential input 64 includes a positive node 68 and a negative node 70. Positive node 68 of input 64 of transconductance stage 50 is coupled to negative node 32 of intermediate output 28 of second order filter section 12. Negative node 70 of input 64 of transconductance stage 50 is coupled to positive node 30 of intermediate output 28 of second order filter section 12. Output 66 of transconductance stage 50 includes a positive node 72 and a negative node 74. Positive node 72 of output 66 of transconductance stage 50 is coupled to positive node 42 of output 36 of second order filter section 14. Negative node 74 of output 66 of transconductance stage 50 is coupled to negative node 44 of output 36 of second order filter section 14.

Filter 10 exhibits a transfer function between differential output 36 of second order filter section 14 and differential input 34 of second order filter section 14 of:

$$\frac{V_{out}}{V_{inb}} = \frac{-s^2 k_1 g_{m6} + s k_2 g_{m5} + k_3}{s^2 + s k_4 + k_5} \quad (1)$$

where $k_1$, $k_2$, $k_3$, $k_4$, and $k_5$ are constants;

$g_{m5}$ = the transconductance of transconductance stage 48;

$g_{m6}$ = the transconductance of transconductance stage 50;

$V_{out}$ = a voltage between nodes 42 and 44 of output 36;

$V_{inb}$=a voltage between nodes 38 and 40 of input 34; and
s=jω, where ω is a frequency of $V_{inb}$ and $j=\sqrt{-1}$.

Such a transfer function is biquadratic because it contains complete quadratic equations in both the numerator and the denominator. The boost of filter 10 between output 36 and input 34 is controlled by the coefficient of the S term in the numerator of Equation (1). Because the coefficient of $s^2$ depends on the transconductance of transconductance stage 50, $g_6$, the boost of filter 10 may be specified by specifying the transconductance of stage 50. Because constants $k_1$, $k_2$, $k_3$, $k_4$, and $k_5$ are independent of $g_{m6}$, the boost of filter 10 may be specified without otherwise affecting the transfer function. The location of zeros of the transfer function provided in Equation (1) is determined by the coefficient of the S term in the numerator of the transfer function. Therefore, the location of the asymmetric zeros may be specified by specifying the transconductance of transconductance stage 48, $g_{m5}$. Because constants $k$, $_1k$, $_2k$, $_3k$, $_4$and k are independent of $g_{m5}$, the location of zeros of the transfer function provided in Equation (1) may be specified without otherwise affecting the transfer function. The magnitude of constants $k_1$, $k_2$, $k_3$, $k_4$, and $k_5$ are determined by individual components of second order filter section 12 and second order filter section 14, described in greater detail below.

Figure 2:
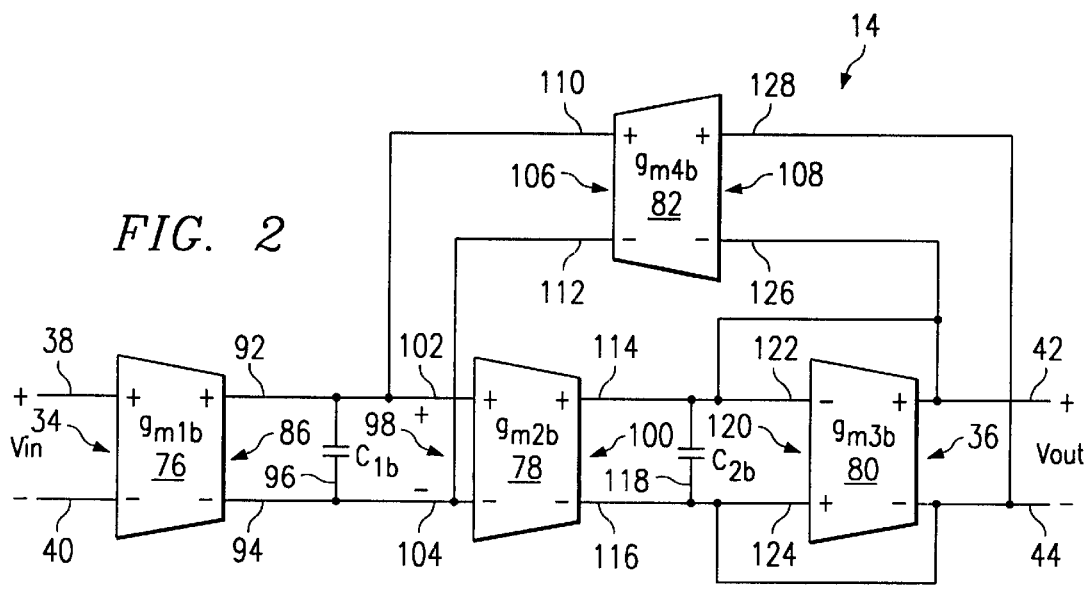
FIG. 2 is a block diagram of a first type of second order filter section of the filter illustrated in FIG. 1.

FIG. 2 is a block diagram of second order filter section 14. Second order filter section 14 includes transconductance stages 76, 78, 80, and 82, having transconductances of $g_{m1b}$, $g_{m2b}$, $g_{m3b}$, and $g_{m4b}$, respectively. The illustrated combination of transconductance stages 76, 78, 80, and 82 produces a second order transfer function between output 36 and input 34 of second order filter section 14, and that includes no $S^2$ or s term in the numerator. As described in greater detail in conjunction with FIG. 3, portions of second order filter section 12 are provided through gain stage 46 to modify the transfer function between output 36 and input 34 to produce a biquadratic transfer function, which includes an $S^2$ term and an s term in the numerator, between output 36 and input 34. Therefore, the transfer function between output 36 and input 34 includes a boost term and has asymmetric zeros. Such a transfer function for this portion of filter 10 is desirable. Second order filter section 14 is described below with reference to FIG. 2.

Transconductance stage 76 includes differential input 34 and a differential output 86. Input 34 may receive voltage input $V_{inb}$ between nodes 38 and 40. Output 86 includes a positive node 92 and a negative node 94. A capacitor 96 having a capacitance of $c_{1b}$, connects node 92 to node 94.

Transconductance stage 78 includes a differential input 98 and a differential output 100. Input 98 includes a positive node 102 and a negative node 104. Positive node 102 of input 98 of transconductance stage 78 is connected to positive node 92 of output 86 of transconductance stage 76. Negative node 104 of input 98 of transconductance stage 78 is connected to negative node 94 of output 86 of transconductance stage 76. Output 100 of transconductance stage 78 has a positive node 114 and a negative node 116. A capacitor 118 having a capacitance of $c_{2b}$, connects output node 114 to output node 116.

Transconductance stage 80 has a differential input 120 and differential output 36. Input 120 has a negative node 122 and a positive node 124. Negative node 122 of input 120 of transconductance stage 80 is coupled to positive node 114 of output 100 of transconductance stage 78. Positive node 124 of input 120 of transconductance stage 80 is coupled to negative node 116 of output 100 of transconductance stage 78. Output 36 of transconductance stage 80 has positive node 42 and negative node 44. Negative node 44 of output 36 is coupled to positive node 124 of input 120. Positive node 42 of output 36 is coupled to negative node 122 of input 120. Positive node 42 of output 36 is also coupled to a negative node 126 of input 108 of transconductance stage 82. Negative node 44 of output 36 of transconductance stage 80 is also coupled to a positive node 128 of an input 108 of transconductance stage 82.

Transconductance stage 82 has a differential output 106 and a differential input 108. Output 106 has a positive node 110 and a negative node 112. Positive node 110 of output 106 of transconductance stage 82 is coupled to positive node 92 of output 86 of transconductance stage 76. Negative node 112 of output 106 of transconductance stage 82 is coupled to negative node 94 of output 86 of transconductance stage 76.

Second order filter section 14 produces a voltage output, $V_{out}$, across positive node 42 and negative node 44 of output 36 of transconductance stage 80 based on an input $V_{inb}$ applied across positive node 38 and negative node 40 of input 34 of transconductance stage 76. A second order transfer function for second order filter section 14, in the absence of connections to other portions of filter 10, is defined as $$\frac{V_{out}}{V_{inb}} = \frac{\frac{g_{m1b}g_{m2b}}{c_{1b}c_{2b}}}{s^2 + s\frac{g_{m3b}}{c_{2b}} + \frac{g_{m2b}g_{m4b}}{c_{1b}c_{2b}}} \qquad (2)$$

where $V_{out}$=voltage between nodes 42 and 44 of output 36;

$V_{inb}$=voltage between nodes 38 and 40 of input 34;

$g_{m1b}$ is the transconductance of transconductance stage 76;

$g_{m2b}$ is the transconductance of transconductance stage 78;

$g_{m3b}$ is the transconductance of transconductance stage 80;

$g_{m4b}$ is the transconductance of transconductance stage 82;

$C_{1b}$ is the capacitance of capacitor 96;

$C_{2b}$ is the capacitance of capacitor 118; and s is jω, where ω is a frequency of $V_{inb}$, and $j=\sqrt{-1}$.

Through combination with second order filter section 12 and gain stage 46, the above transfer function defined in Equation (2), for second order filter section 14 is modified to produce the desired transfer function defined in Equation (1). Combination of second order filter section 14 with second order filter section 12 is described in greater detail below with reference to FIG. 3.

Figure 3:
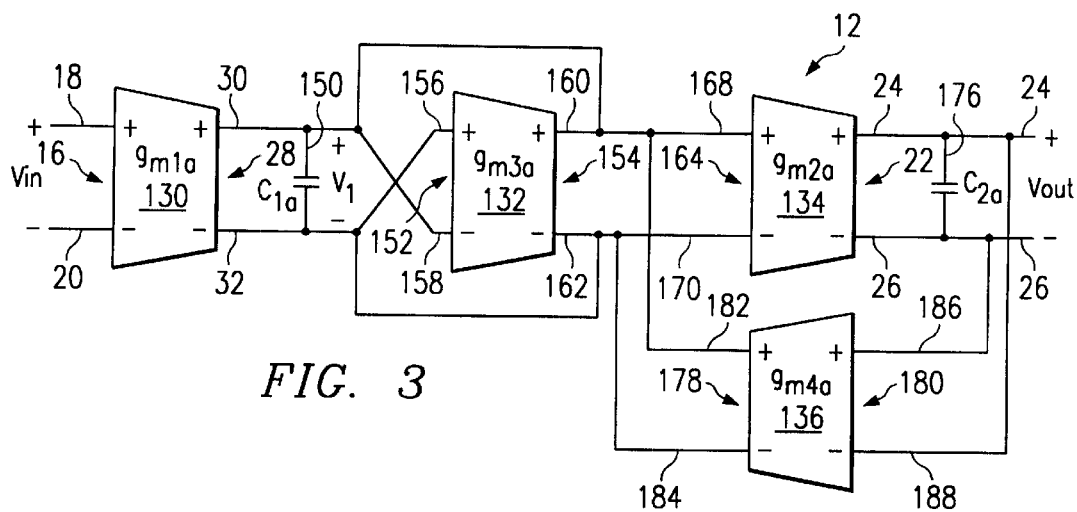
FIG. 3 is a block diagram of a second type of second order filter section of the filter of FIG. 1.

FIG. 3 is a block diagram of second order filter section 12. Second order filter section 12 includes transconductance stages 130, 132, 134, and 136, having transconductances of $g_{m1a}$, $g_{m3a}$, $g_{m2a}$, and $g_{m4a}$, respectively. Second order filter section 12 has differential input 16, which is also an input to transconductance stage 130 and filter 10. Differential input 16 includes positive node 18 and negative node 20. Transconductance stage 130 includes differential output 28 having positive node 30 and negative node 32. A capacitor 150 having a capacitance of $c_1a$ couples positive node 30 to negative node 32. An intermediate output voltage $V_1$ is produced between nodes 30 and 32 of output 28. Intermediate output voltage $V_1$ is provided to input 64 of transconductance stage 50, and output 66 of transconductance stage 50 is provided to output 36 of second order filter section 14. This feeding forward of intermediate output voltage $V_1$ contributes to the creation of the desired transfer function in Equation (1).

Transconductance stage 132 has a differential input 152 and a differential output 154. Differential input 152 includes a positive node 156 and a negative node 158. Positive node 156 is coupled, to negative node 32 of output 28 of transconductance stage 130. Negative node 158 is coupled to positive node 30 of output 28 of transconductance stage 130. Output 154 includes a positive node 160 and a negative node 162. Positive node 160 of output 154 of transconductance stage 132 is coupled to negative node 158 of input 152 of transconductance stage 132. Negative node 162 of output 154 of transconductance stage 132 is coupled to positive node 156 of input 152 of transconductance stage 132.

Transconductance stage 134 has a differential input 164 and differential output 22. Differential input 164 includes a positive node 168 and a negative node 170. Positive node 168 of input 164 is coupled to positive node 160 of output 154. Negative node 170 of input 164 is coupled to negative node 162 of output 154. Differential output 22 includes positive node 24 and negative node 26. A capacitor 176 having a capacitance of $c_{2a}$ is connected between positive node 24 and negative node 26.

Output voltage $V_{out}$ between nodes 24 and 26 is provided by second order filter section 12 for reception by input 34 of second order filter section 14, as illustrated in FIG. 1. Transconductance stage 136 has a differential output 178 and a differential input 180. Differential output 178 includes a positive node 182 and a negative node 184. Positive node 182 of differential output 178 is coupled to positive node 160 of output 154. Negative node 184 of differential output 178 is coupled to negative output 162 of differential output 154. Differential input 180 includes a positive node 186 and a negative node 188. Positive node 186 is coupled to negative node 26 of differential output 22. Negative node 188 of differential input 180 is coupled to positive node 24 of differential output 22.

A transfer function between output 22 and input 16 is defined as $$\frac{V_{out}}{V_{ina}} = \frac{\frac{g_{m1a}g_{m2a}}{c_{1a}c_{2a}}}{s^2 + s\frac{g_{m3a}}{c_{1a}} + \frac{g_{m2a}g_{m4a}}{c_{1a}c_{2a}}} \quad (3)$$

where $V_{outa}$=a voltage between nodes 24 and 26;

$V_{ina}$=a voltage between nodes 18 and 20;

$g_{m1a}$=transconductance of transconductance stage 130;

$g_{m3a}$=transconductance of transconductance stage 132;

$g_{m2a}$=transconductance of transconductance stage 134;

$g_{m4a}$=transconductance of transconductance stage 136;

$c_{1a}$=capacitance of capacitor 150;

$c_{2a}$=capacitance of capacitor 176; and $j\omega$, where $\omega$ is a frequency of $V_{ina}$ and $j=\sqrt{-1}$.

In addition, a transfer function between intermediate output 28 and $V_1$ and $V_{ina}$ may be defined as $$\frac{V_{out}}{V_{ina}} = \frac{s\frac{g_{m1a}}{c_{1a}}}{s^2 + s\frac{g_{m3a}}{c_{1a}} + \frac{g_{m2a}g_{m4a}}{c_{1a}c_{2a}}} \quad (4)$$

where $V_1$=a voltage between nodes 30 and 32; and $V_{outa}$, $g_{m1a}$, $g_{gm2a}$, $g_{m3a}$, $g_{m4a}$, $c_{1a}$, $c_{2a}$, and s are defined above.

A combination of the above transfer functions for second order filter section 12 and second order filter section 14 and gain stage 46 provides a transfer function for filter 10 of $$\frac{V_{out}}{V_{inb}} = \frac{-s^2\frac{c_{2a}g_{m6}}{c_{2b}g_{m2a}} - s\frac{g_{m5}}{c_{2b}} + \frac{g_{m1b}g_{m2b}}{c_{1b}c_{2b}}}{s^2 + s\frac{g_{m3b}}{c_{2b}} + \frac{g_{m2b}g_{m4b}}{c_{1b}c_{2b}}} \quad (5)$$

where $V_{out}$=a voltage between nodes 42 and 44;

$V_{inb}$=a voltage between nodes 38 and 40; and $g_{m1a}$, $g_{m2a}$, $g_{m3a}$, $g_{m4a}$, $g_{m5}$, $g_{m6}$, $g_{m1b}$, $g_{m2b}$, $g_{m3b}$, $g_{m4b}$, $c_{1a}$, $c_{2a}$, $c_{1b}$, $c_{2b}$, and s are defined above.

Thus filter 10 provides a transfer function between $V_{out}$ and $V_{inb}$ with a boost term, corresponding to the $s^2$ term in the numerator of equation 5, and an asymmetrical zero term, corresponding to the s term in the numerator of equation 5. The transfer function provided in Equation (5) allows specification of the boost term by specifying gain of transconductance stage 50. In addition the location of the asymmetric zeros may be specified by adjustment of the gain of transconductance stage 48. Therefore, filter 10 provides a filter with easily adjustable boost and asymmetrical zero terms that may be adjusted without modifying any other components of filter 10 or otherwise affecting the resulting transfer function. In addition such a transfer function is provided without suffering the problems associated with driving the bottom plate of a capacitor, as described above in the Background of the Invention. Such a filter may be used in a variety of applications, but has been found to be particularly advantageous in a read channel of a hard disk drive system. The use of such a filter in a read channel of a hard disk drive system is described in conjunction with FIGS. 4 and 5.

Figure 4:
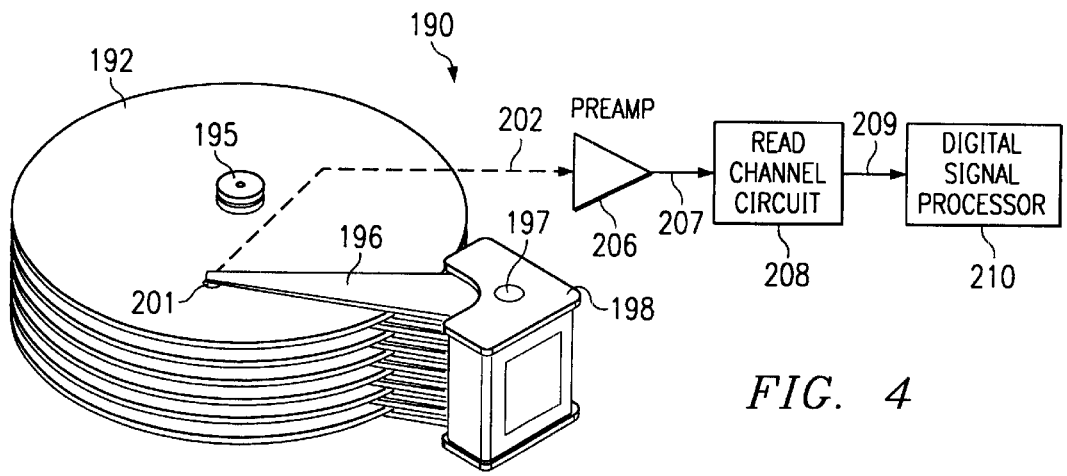
FIG. 4 is a block diagram of a hard disk drive incorporating the filter of FIG. 1.

FIG. 4 is a schematic diagram of a hard disk drive system incorporating the filter illustrated in FIG. 1. A hard disk drive system 190 includes a plurality of magnetic disks 192. Magnetic disks 192 are fixedly secured to a spindle 195. Spindle 195 is rotationally driven by a spindle motor (not explicitly shown). A plurality of arms 196 supported for pivotal movement about an access defined by a pivotal access 197. Pivotal movement of arms 196 is controlled by a voice coil motor 198. At an outer end of each arm 196 is a read/write head 201. Head 201 includes respective portions that serve as a read head and a write head for reading from, and writing to, magnetic disks 192, respectively.

A magnetic disk output signal 202 is provided by head 201 to an input of preamplifier 206. An output signal 207 of preamplifier 206 is provided to a read channel circuit 208. An output signal 209 of read channel circuit 208 is provided to a digital signal processor 210. Read channel circuit 208 includes a filter, such as filter 10 described in conjunction with FIGS. 1 through 3.

Figure 5:
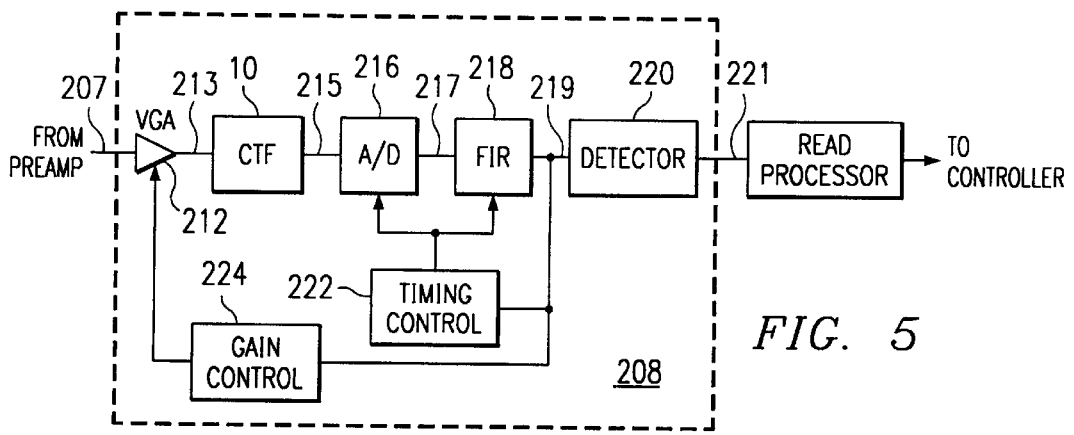
FIG. 5 is a block diagram of a read channel in the hard disk drive of FIG. 4 incorporating the filter of FIG. 1.

FIG. 5 illustrates read channel 208. Read channel 208 includes a variable gain amplifier 212. Variable gain amplifier 212 receives output signal 207 from preamp 206. Variable gain amplifier 212 provides an output signal 213 to filter 10. Filter 10 conditions output signal 213 and provides an analog signal 215 to an analog to digital converter 216. Analog signal 215 includes characteristics defined by output signal 213 and the transfer function of filter 10. Analog to digital converter 216 receives analog signal 215 and produces a digital output signal 217. Digital output signal 217 is received by finite impulse response filter 218. Finite impulse response filter 218 produces a digital output signal 219 that is equalized to a desired response. Digital output signal 219 is provided to a detector 220. Detector 220 detects data written to magnetic disks 192, illustrated in FIG. 4, based on received digital output signal 219 and provides an output 221 to a read processor 210 for further processing. Digital output signal 219 is also provided to a timing control unit 222. Timing control unit 222 adjusts the timing of sampling performed by analog to digital converter 216 and finite impulse response filter 218. Signal 219 is also provided to a gain control unit 224 that appropriately adjusts the gain of variable gain amplifier 212.

Although the present invention and its advantages have been described in detail, it should be understood the various changes, substitutions, and alterations can be made therein without departing from the spirit and scope of the present invention as defined by the appended claims.

What is claimed is:

1. An apparatus for filtering an input signal comprising:
    a first second order filter section having an output and an intermediate output;
    a second second order filter section having an input connected to the output of the first second order filter; and
    a gain stage coupling the output of the first second order filter section and the intermediate output of the first second order filter section to the output of the second second order filter section such that a transfer function between the output of the second second order filter section and the input of the second second order filter section is a biquadratic transfer function.

2. The apparatus of claim 1, wherein the first second order filter section has a transfer function, in the absence of the gain stage, between the output of the first second order filter section and an input of the first second order filter of $$\frac{k_6}{s^2 + k_7 s + k_8}$$

where $k_6$, $k_7$, and $k_8$ are constants and s is j$\omega$, where $\omega$ is a frequency of the input signal and j is $\sqrt{-1}$.

3. The apparatus of claim 1, wherein the first second order filter section has a transfer function, in the absence of the gain stage, between the intermediate output of the first second order filter section and an input of the first second order filter section of $$\frac{k_9 s}{s^2 + k_7 s + k_8}$$

where $k_7$, $k_8$, and $k_9$ are constants and s is j$\omega$, where $\omega$ is a frequency of the input signal and j is $\sqrt{-1}$.

4. The apparatus of claim 1, wherein the second second order filter section has a transfer function, in the absence of the gain stage, between the output of the second second order filter section and the input of the second second order filter of:

$$\frac{k_{10}}{s^2 + k_{11} s + k_{12}}$$

where $k_{10}$, $k_{11}$, and $k_{12}$ are constants and s is j$\omega$, where $\omega$ is a frequency of the input signal and j is $\sqrt{-1}$.

5. The apparatus of claim 1, wherein the transfer function is $$\frac{k_1 s^2 + k_2 s + k_3}{s^2 + k_4 s + k_5}$$

where $k_1$, $k_2$, $k_3$, $k_4$, and $k_5$ are constants and s is j$\omega$, where $\omega$ is a frequency of the input signal, j is $\sqrt{-1}$, and the gain stage is operable to specify $k_1$ and $k_2$ without affecting $k_3$, $k_4$, and $k_5$.

6. The apparatus of claim 1, wherein the gain stage further comprises a first transconductance stage having an input coupled to an output of the first second order filter section and having an output coupled to the output of the second second order filter section.

7. The apparatus of claim 6, wherein the gain stage further comprises a second transconductance stage having an input coupled to the intermediate output of the first second order filter and an output coupled to the output of the second second order filter section.

8. The apparatus of claim 1, wherein the first second order filter section further comprises a first, a second, a third, and a fourth transconductance stage, each having a differential input and a differential output, the differential input of the third transconductance stage being coupled to the differential output of the first transconductance stage, the differential input of the second transconductance stage and the differential output of the fourth transconductance stage being coupled to the differential output of the third transconductance stage, the differential input of the fourth transconductance stage being coupled to the differential output of the second transconductance stage, and the differential output of the third transconductance stage being coupled to the differential input of the third transconductance stage.

9. The apparatus of claim 1, wherein the second second order filter section further comprises a first, a second, a third, and a fourth transconductance stage, each having a differential input and a differential output, the differential output of the first transconductance stage being coupled to the differential input of the second transconductance stage and also being coupled to the differential output of the fourth transconductance stage, the differential input of the fourth transconductance stage being coupled to the differential output of the third transconductance stage, the differential output of the second transconductance stage being coupled to the differential input of the third transconductance stage, and the differential input of the third transconductance stage being coupled to the differential output of the third transconductance stage.

10. A hard disk drive system comprising:
    a rotating magnetic disk having information magnetically stored thereon;
    a read head supported adjacent said disk and operative to read information from said disk and to output an analog signal embodying the information; and
    a read channel circuit that has an input coupled to the analog signal, the read channel including a filter for filtering a signal indicative of the analog signal, the filter comprising:
        a first second order filter section having an output and an intermediate output;
        a second second order filter section having an input connected to the output of the first biquadratic filter; and
        a gain stage coupling the output of the first second order filter section and the intermediate output of the first second order filter section to the output of the second second order filter section such that a transfer function between the output of the second second order filter section and the input of the second second order filter section is a biquadratic transfer function.

11. The hard disk drive of claim 10, wherein the first second order filter section has a transfer function, in the absence of the gain stage, between the output of the first second order filter section and an input of the first second order filter section of $$\frac{k_6}{s^2 + k_7 s + k_8}$$

where $k_6$, $k_7$, and $k_8$ are constants and s is j$\omega$, where $\omega$ is a frequency of the analog signal and j is $\sqrt{-1}$.

12. The hard disk drive of claim 10, wherein the first second order filter section has a transfer function, in the absence of the gain stage, between the intermediate output of the first second order filter section and an input of the first second order filter section of $$\frac{k_9 s}{s^2 + k_7 s + k_8}$$

where $k_7$, $k_8$, and $k_9$ are constants and s is j$\omega$, where $\omega$ is a frequency of the input signal and j is $\sqrt{-1}$.

13. The hard disk drive of claim 10, wherein the second second order filter section has a transfer function, in the absence of the gain stage, between the output of the second second order filter section and the input of the second second order filter section of:

$$\frac{k_{10}}{s^2 + k_{11} s + k_{12}}$$

where $k_{10}$, $k_{11}$, and $k_{12}$ are constants and s is j$\omega$, where $\omega$ is a frequency of the analog signal and j is $\sqrt{-1}$.

14. The hard disk drive of claim 10, wherein the transfer function is $$\frac{k_1 s^2 + k_2 s + k_3}{s^2 + k_4 s + k_5}$$

were $k_1$, $k_2$, $k_3$, $k_4$, and $k_5$ are constants and s is j$\omega$, where $\omega$ is a frequency of the input signal, j is $\sqrt{-1}$ and the gain stage is operable to specify $k_1$, and $k_2$ without affecting $k_3$, $k_4$, and $k_5$.

15. The hard disk drive, of claim 10, wherein the gain stage further comprises a first transconductance stage having an input coupled to an output of the first second order filter section and having an output coupled to the output of the second second order filter section.

16. The hard disk drive of claim 15, wherein the gain stage further comprises a second transconductance stage having an input coupled to the intermediate output of the first second order filter section and an output coupled to the output of the second second order filter section.

17. A method of filtering an input signal, the method comprising the steps of:

coupling an output of a first second order filter stage to an input of a second second order filter stage;

coupling the input signal to the input of the second second order filter stage;

coupling a first input of a gain stage to the output of the first second order filter stage;

coupling a second input of a gain stage to an intermediate output of the first second order filter stage; and coupling an output of the second second order filter stage to at least one output of the gain stage to produce a transfer function between the output of the second second order filter stage and the input of the second second order filter stage having asymmetric zeros and a boost.

18. The method of claim 17, wherein the transfer function is $$\frac{k_1 s^2 + k_2 s + k_3}{s^2 + k_4 s + k_5}$$

where $k_1$, $k_2$, $k_3$, $k_4$, and $k_5$ are constants and s is j$\omega$, where $\omega$ is a frequency of the input signal and j is $\sqrt{-1}$.

19. The method of claim 18, and further comprising designating the gain of a transconductance stage in the gain stage to specify the value of $k_1$ without affecting the value of $k_4$.

20. The method of claim 18, and further comprising designating the gain of a transconductance stage in the gain stage to specify the value of $k_2$ without affecting the value of $k_5$.

* * * * *